United States Patent
Chen et al.

(10) Patent No.: US 6,245,627 B1
(45) Date of Patent: Jun. 12, 2001

(54) METHOD OF FABRICATING A LOAD RESISTOR FOR AN SRAM

(75) Inventors: Wen-Ji Chen, Chang-Hua Hsien; Shih-Ying Hsu, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/251,007

(22) Filed: Feb. 16, 1999

(51) Int. Cl.$^7$ .............................................. H01L 21/8244
(52) U.S. Cl. .......................... 438/382; 438/210; 438/238; 438/384; 438/385
(58) Field of Search ..................... 438/210, 238, 438/383, 384, 385, 382, 381, FOR 220, FOR 429; 257/380, 536, 538

(56) References Cited

U.S. PATENT DOCUMENTS

| | | | |
|---|---|---|---|
| 4,727,045 | * | 2/1988 | Cheung et al. ...................... 438/384 |
| 4,755,480 | * | 7/1988 | Yau et al. ........................... 438/384 |
| 5,159,430 | * | 10/1992 | Manning et al. ..................... 257/381 |
| 5,838,044 | * | 11/1998 | Chang et al. ......................... 257/369 |
| 5,877,059 | * | 4/1999 | Harward ................................ 438/381 |
| 5,952,722 | * | 9/1999 | Watanabe ............................. 257/754 |
| 5,998,276 | * | 12/1999 | Batra et al. .......................... 438/382 |
| 6,046,080 | * | 4/2000 | Wu ....................................... 438/238 |

FOREIGN PATENT DOCUMENTS 63-229735 * 9/1988 (JP) .............................. 438/FOR 429

* cited by examiner

Primary Examiner—Carl Whitehead, Jr.
Assistant Examiner—Toniae M. Thomas
(74) Attorney, Agent, or Firm—Thomas, Kayden, Worstemeyer & Risley

(57) ABSTRACT

A method of fabricating a load resistor for an SRAM. A substrate has a polysilicon layer formed thereon through a buried contact process. An inter-layer dielectric layer is formed over the substrate and then patterned to form an opening that exposes the polysilicon layer. A poly via is then formed in the opening to serve as a load resistor. The inter-layer dielectric layer is patterned to form a contact window, which is then filled with a conductive layer to form a contact.

11 Claims, 4 Drawing Sheets

METHOD OF FABRICATING A LOAD RESISTOR FOR AN SRAM

BACKGROUND OF THE INVENTION

1. Field of the Invention

The invention relates to a method of fabricating an integrated circuit, and more particularly to a method of fabricating a load resistor for a static random access memory (SRAM).

2. Description of the Related Art

A SRAM is widely used in integrated circuits, and plays an especially important role in the electronic industry. The unanimous target for the industries is to fabricate a device with reduced dimensions and high quality. A load resistor is one of the devices that constitute a SRAM cell and is usually made of lightly doped or undoped polysilicon.

A circuit diagram of a SRAM cell is shown in FIG. 1. The SRAM cell includes two load resistors, $R_1$ and $R_2$, two pull down transistors, $Q_1$ and $Q_2$, and two pass transistors, $Q_3$ and $Q_4$. A first polysilicon layer is employed as a gate of the transistor $Q_1$, $Q_2$, $Q_3$, $Q_4$, and a second polysilicon is formed as load resistor. The second polysilicon layer comprises a highly resistant part used as a load resistor, and a minorly resistant part used as an interconnect. In the prior technique, the low resistant part, that is, the interconnect, is formed by heavily doping a part of the second polysilicon layer, while the high resistant part, that is, the load resistor, is formed by lightly doping the second polysilicon layer. The interconnect and the load resistor construct a circuit path from the power source $V_{CC}$ to the nodes A and B.

FIGS. 2A–2D are schematic, cross-sectional views illustrating fabrication of an SRAM. Referring to FIG. 2A, a substrate 200 has at least an isolation structure 202, a buried contact 204 and a defined polysilicon layer 206 formed thereon. An inter-poly dielectric (IPD) layer 208 is formed over the substrate 200.

The IPD layer 208 is patterned and then etched to remove a portion of the IPD layer 208 and to expose the polysilicon layer 206, as shown in FIG. 2B. A polysilicon layer 210 is formed on the substrate 200 and is doped with impurities by ion implantation 212. The dosage of the ion implantation 212 is decided by the resistivity of a load resistor in a subsequent process. The polysilicon layer 210 is then defined to form a desired pattern for an interconnect and the load resistor.

An ion implantation mask 214 is then formed on the defined polysilicon layer 210 to cover a pre-determined position for the poly load 210b, as shown in FIG. 2C. An ion implantation 216 is performed on the polysilicon layer 210a exposed by the ion implantation mask 214. The polysilicon layer 210a with ion implantation 216 serves as a part of the interconnect and the polysilicon 210b covered by the ion implantation mask 214 is used as a load resistor. The polysilicon layer 210a should be doped with a high enough dosage by the ion implantation 216, to thereby serve as the interconnect. An annealing step is performed on the polysilicon layer 210a, 210b to activate the ions inside.

Referring to FIG. 2D, an inter-layer dielectric (ILD) layer 218 is formed over the substrate 200 and a contact 220 is formed within the ILD layer 218 and the IPD layer 208a. A wiring line 222 is then formed on the ILD layer 218 and is electrically connected with the substrate 200 through the contact 220.

As mentioned above, the processes for the load resistor 210b at least includes the steps of deposition, ion implantation, annealing and patterning. The process is not only complicated but also wastes fabricating time and cost.

In addition, when the ILD layer 218 is formed by plasma enhanced chemical vapor deposition (PECVD), the charges in the plasma environment easily disrupt the load resistor 210b, such that the load resistor 210b cannot sustain its high resistivity, thereby affecting the reliability of the device.

SUMMARY OF THE INVENTION

Therefore, the invention is directed towards a method of fabricating a load resistor for an SRAM. A substrate having a polysilicon layer is formed thereon through a buried contact process. An inter-layer dielectric layer is formed over the substrate and then patterned to form an opening therein to expose the polysilicon layer. A poly via is then formed in the opening to serve as a load resistor in which the poly via is doped in-situ to obtain a desired resistivity. The inter-layer dielectric layer is patterned to form a contact window, which is then filled with a conductive layer to form a contact. The interconnects are formed on the contact and the load resistor to electrically connect with the substrate and $V_{CC}$.

The process of the poly resistor in this invention is simpler than that of prior art, such that the manufacturing time and cost can be reduced. Additionally, the load resistor is covered with the interconnect; therefore the disruption of the load resistor by the charges can be prevented.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
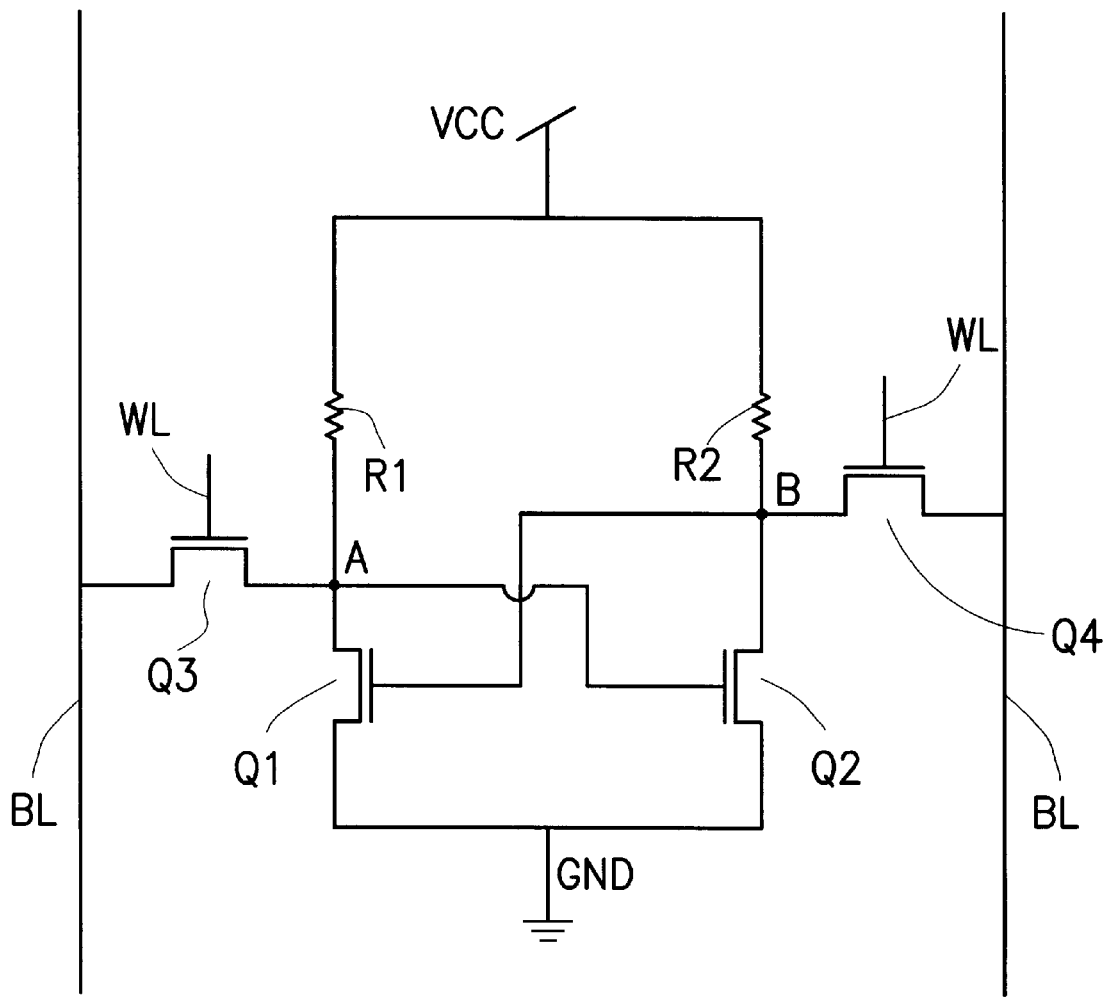
FIG. 1 is a circuit diagram of a SRAM cell as known in the prior art.
Figure 2A:
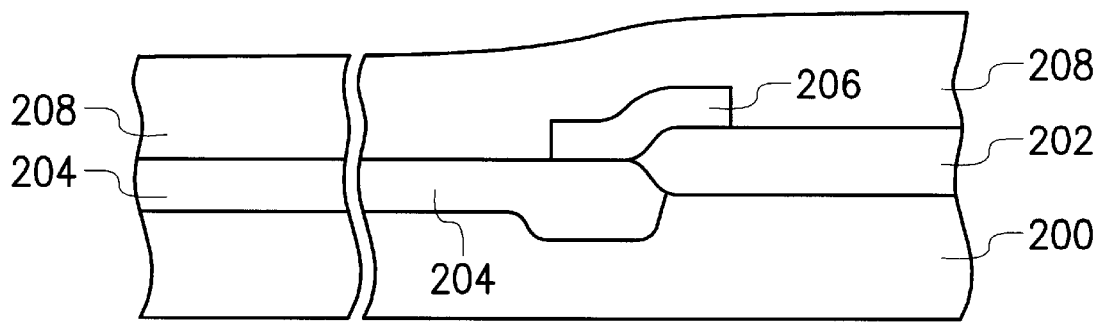
FIGS. 2A–2D are schematic, cross-sectional views illustrating fabrication of a load resistor for an SRAM as known in the prior art.
Figure 2B:
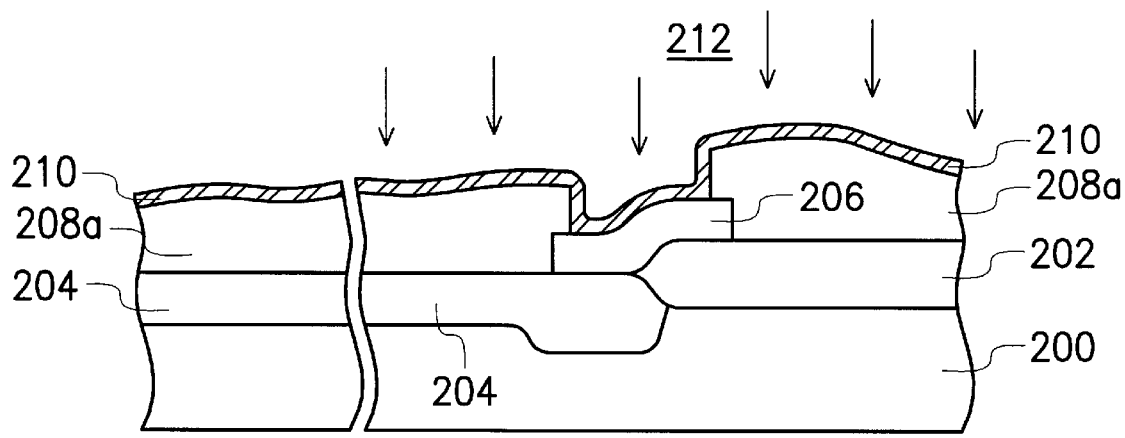
Figure 2C:
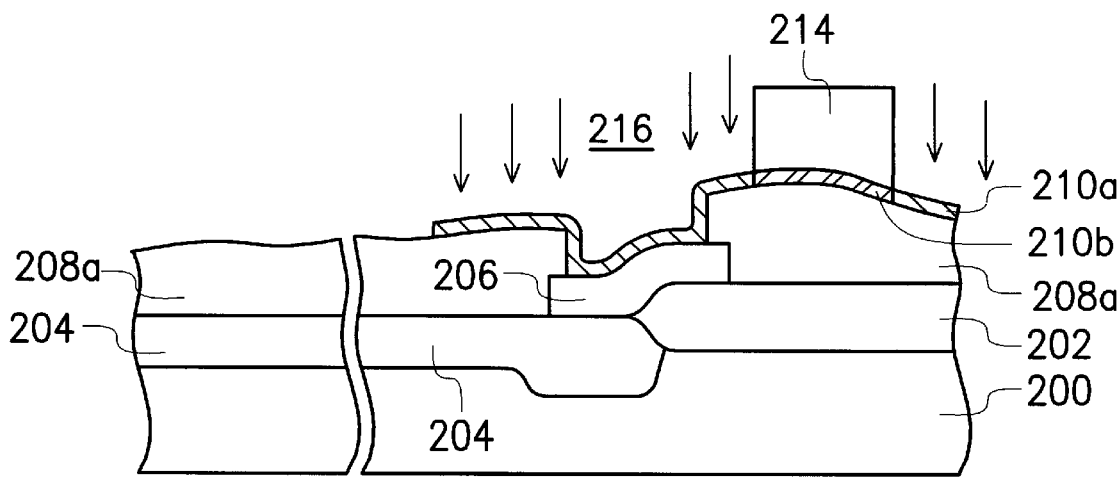
Figure 2D:
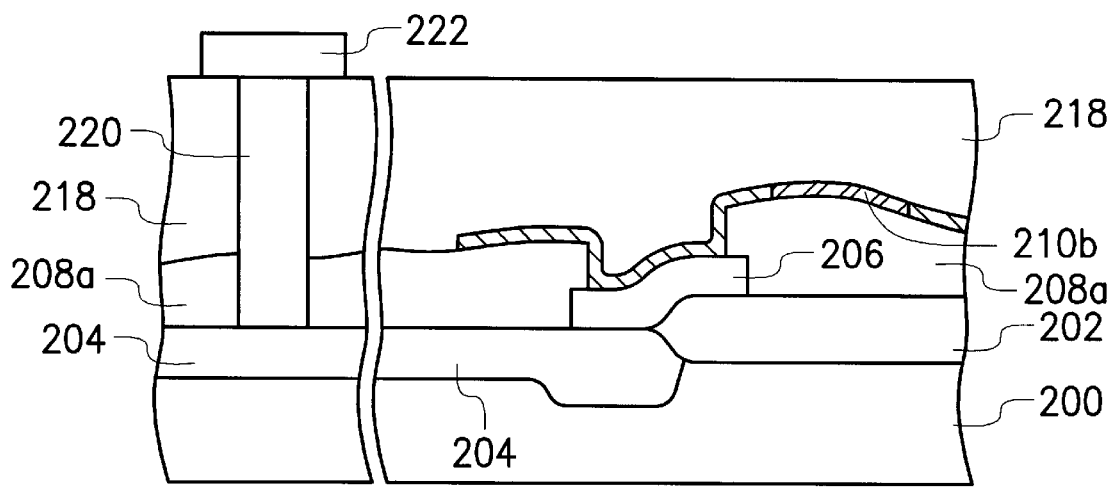

Reference will now be made in detail to the present preferred embodiments of the invention, examples of which are illustrated in the accompanying drawings. Wherever possible, the same reference numbers are used in the drawings and the description to refer to the same or like parts.

The fabricating method of this invention includes forming an inter-layer dielectric (ILD) layer over a substrate wherein a buried contact process is performed on the substrate to form a polysilicon layer thereon. An opening is formed within the ILD layer to expose the polysilicon layer. A poly via is formed to fill in the opening and is doped in-situ with a desired dosage for use as a load resistor. The ILD layer is defined to form a contact window, which is then filled with a conductive layer to form a contact. A defined interconnect is formed on the ILD layer to electrically connect to the contact and the substrate. The process for the load resistor is simpler, so that both the fabrication time and cost are lessened and the productivity is thus increased.

Figure 3A:
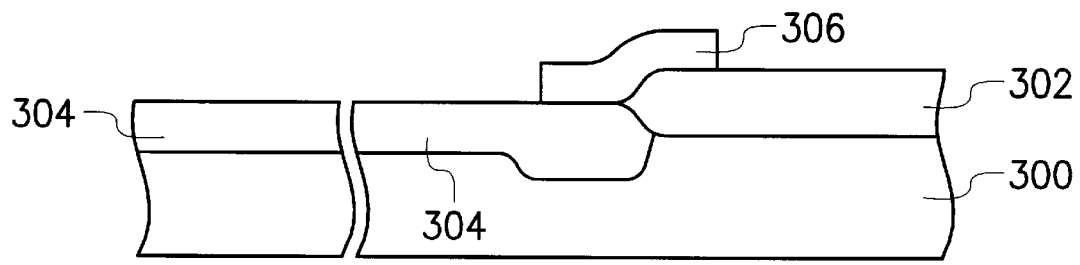
FIGS. 3A–3D are schematic, cross-sectional views illustrating fabrication of a load resistor for an SRAM in a preferred embodiment according to the invention.

FIGS. 3A–3D are schematic, cross-sectional views of a load resistor for an SRAM in a preferred embodiment according to the invention. Referring to FIG. 3A, the structure including an isolation structure 302, a buried contact 304 and a polysilicon layer 306 on a semiconductor substrate 300 as shown in FIG. 3A is fabricated by the well-known buried contact process. A portion of the polysilicon layer 306 is disposed on the buried contact 304 and a portion of the polysilicon layer 306 lies on the isolation structure 302.

Figure 3B:
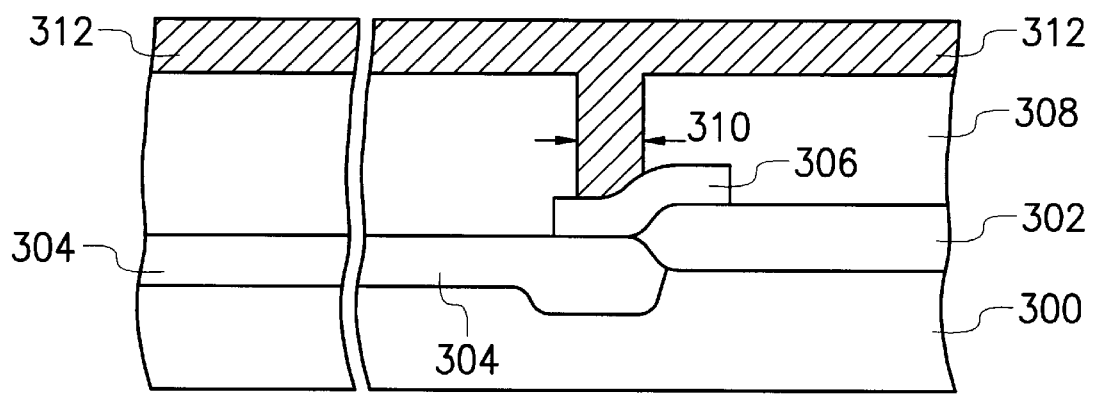

Referring to FIG. 3B, an ILD layer 308, such as PSG or BPSG, is deposited and planarized by chemical mechanical polishing (CMP), for example, to a thickness of about 10,000 angstroms on the substrate 300. The ILD layer 308 is then patterned by photolithography, such that an opening 310 is formed within the ILD layer 308 to expose the polysilicon layer 306. A polysilicon layer 312 is formed in the opening 310 and extends onto the ILD layer 308. The polysilicon layer 312 is used as a load resistor and therefore it is necessary for the polysilicon layer 312 to be doped with impurities, in a process such as in-situ doping. For example, the polysilicon layer 312 is deposited using $SiH_4$ with a flow rate of about 200 $cm^3$/min in combination with a flow of $PH_3$. The deposition temperature is lower than 570° C., which corresponds to an ambient pressure of about 350 Torr. By adjusting the ratio of $PH_3/SiH_4$, the dosage of the dopants of the polysilicon layer 312 is controlled so that a predetermined resistivity is obtained.

Figure 3C:
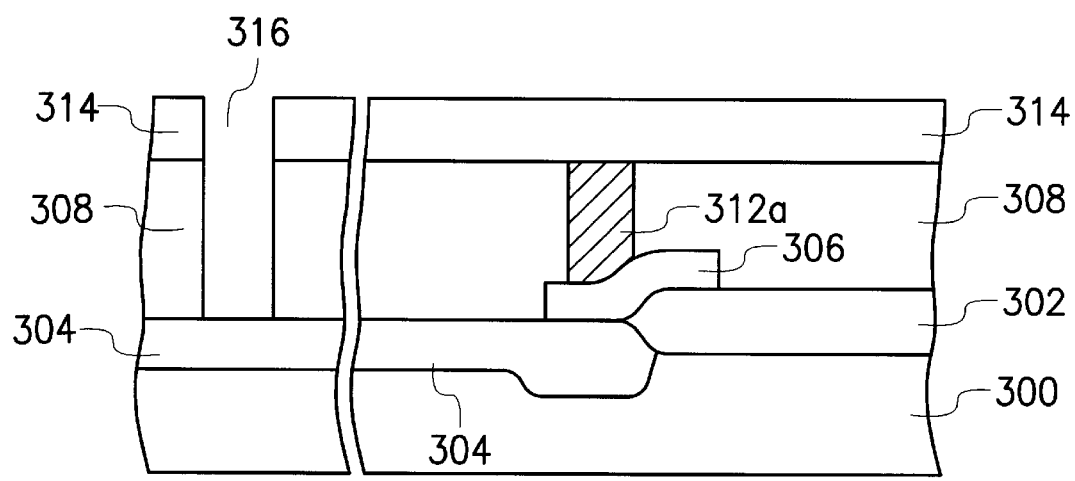

The polysilicon layer 312 on the ILD layer 308 is removed by etching back or chemical mechanical polishing (CMP), for example, and as a result, a poly via 312a is formed in the opening 310 to serve as a load resistor, as shown in FIG. 3C. When the resistivity of the poly via 312a is about 10E5, the diameter is about 0.35 μm and the height is about 10000 angstroms; accordingly, a resistance of about 1E10 is obtained by the load resistor 3 12a.

Figure 3D:
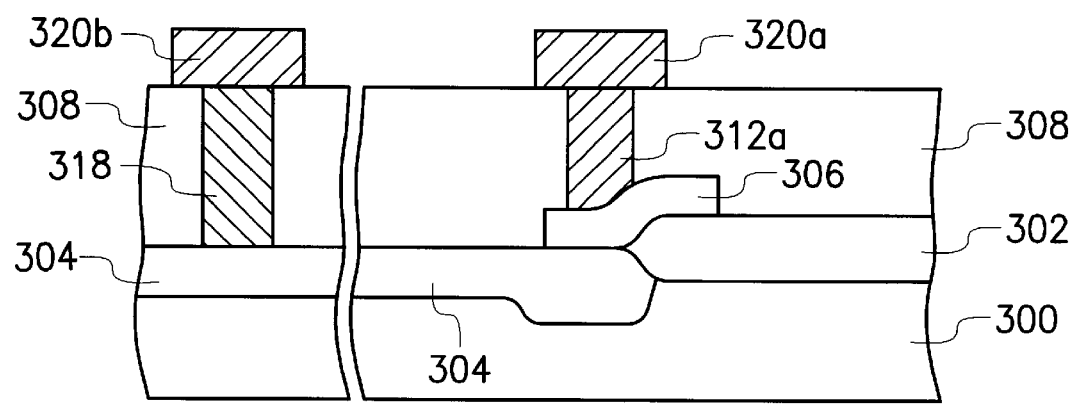

Referring to FIG. 3C again, after the process for the load resistor 312a is achieved, a photoresist layer 314 is then coated on the ILD layer 308 to cover the load resistor 312a. The formation of the photoresist layer 314 is used to define the ILD layer 308 to form a contact window 316 within the ILD layer 308 and a portion of the substrate 300 is exposed. Thereafter, the photoresist layer 314 is removed and a conductive layer 318 such as tungsten fills the contact window 316 to form a contact and electrically connect to the substrate 300, as illustrated in FIG. 3D. The formation of the contact further includes sputtering a barrier layer (not shown), such as Ti/TiN, on the contact window 316, depositing tungsten into the contact window and then etching back to form a tungsten plug. Defined metallic layers 320a, 320b serving as interconnects is formed on the ILD layer 308 and respectively connect to the load resistor 312a and the contact 318. The metallic layer 320a 320b are electrically coupled with $V_{CC}$ and the substrate 300. The load resistor 312a is covered with the metallic layer 320a, such that the charges due to the plasma can be discharged by the contact 318 and do not directly make contact with the load resistor 312a. Therefore, the load resistor 312a is not disrupted by the charges and sustains its high resistance.

The process of the load resistor in this invention only includes the deposition., the patterning of an ILD, and the deposition and etching back of the load resistor. Therefore, the formation of the load resistor according to the invention is much easier than that of the prior art. As a result, the process in this invention is simplified, and the manufacturing cycle time and cost can be reduced.

Additionally, the metallic interconnect covers the load resistor to prevent the disruption by the charges and therefore a load resistor with high and stable resistance can be provided.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a load resistor for an SRAM, adapted for a semiconductor substrate and at least having a buried contact and a first polysilicon layer formed on a portion of the buried contact, comprising:

providing an inter-layer dielectric layer on the semiconductor substrate;

forming an opening within the inter-layer dielectric layer to expose the first polysilicon layer;

forming a doped poly via in the opening to form a load resistor, wherein the resistivity of the load resistor depends on a dosage of dopants in the doped poly via;

forming a contact window in the inter-layer dielectric layer, wherein the contact window exposes a portion of the substrate;

forming a contact to fill the contact window; and forming a patterned metallic interconnect on the inter-layer dielectric layer, wherein the patterned metallic interconnect respectively covers the doped poly via and the contact and the doped poly via and the contact are electrically coupled with each other.

2. The method according to claim 1, wherein forming a poly via in the opening further comprises:

forming a second polysilicon layer on the inter-layer dielectric layer to fill the opening; and removing a portion of the second polysilicon layer from the inter-layer dielectric layer to form the load resistor.

3. The method according to claim 2, wherein the portion of the second polysilicon layer on the inter-layer dielectric layer is removed by etching back.

4. The method according to claim 2, wherein the portion of the second polysilicon layer on the inter-layer dielectric layer is removed by chemical mechanical polishing.

5. The method according to claim 1, wherein the poly via is doped in-situ.

6. A method of fabricating a load resistor for an SRAM, adapted for a semiconductor substrate and at least having a buried contact and a first polysilicon layer formed on a portion of the buried contact, comprising:

providing an inter-layer dielectric layer on the semiconductor substrate;

forming an opening within the inter-layer dielectric layer to expose the first polysilicon layer;

forming a poly via in the opening to form a load resistor;

patterning the inter-layer dielectric layer to form a contact window that exposes the substrate;

forming a contact in the contact window; and forming a defined metallic interconnect on the inter-layer dielectric layer to respectively connect with the load resistor and the contact window, wherein the contact and the load resistor are electrically coupled with each other.

7. The method according to claim 6, wherein forming a poly via in the opening further comprises:

forming a second polysilicon layer on the inter-layer dielectric layer to fill the opening; and removing a portion of the second polysilicon layer from the inter-layer dielectric layer to form the load resistor.

8. The method according to claim 7, wherein a portion of the second polysilicon layer on the inter-layer dielectric layer is removed by etching back.

9. The method according to claim 7, wherein the portion of the second polysilicon layer on the inter-layer dielectric layer is removed by chemical mechanical polishing.

10. The method according to claim 6, wherein the poly via is doped in-situ.

11. A method of fabricating a load resistor adapted for a semiconductor substrate, comprising:

performing a buried contact process to at least form a buried contact in the substrate and a first polysilicon layer on a portion of the buried contact;

forming an inter-layer dielectric layer on the semiconductor substrate;

forming an opening within the inter-layer dielectric layer to expose the first polysilicon layer;

forming a doped poly via in the opening as a load resistor, wherein a resistivity of the load resistor depends on a dosage of dopants in the doped poly via;

forming a contact in the inter-layer dielectric layer, wherein the contact is in contact with the substrate; and forming metallic layers respectively on the doped poly via and contact.

* * * * *